United States Patent [19]

Tsurumi et al.

[11] Patent Number: 4,968,649

[45] Date of Patent: Nov. 6, 1990

[54] DIELECTRIC CERAMIC COMPOSITION FOR USE IN HIGH-FREQUENCY RANGE AND PROCESS FOR PREPARING THE SAME

[75] Inventors: Michiaki Tsurumi, Kosai; Kenji Fujimoto, Hamana; Kazuaki Endo, Kosai, all of Japan

[73] Assignee: Fuji Electrochemical Co., Ltd., Tokyo, Japan

[21] Appl. No.: 447,929

[22] Filed: Dec. 8, 1989

[30] Foreign Application Priority Data

Jan. 27, 1989 [JP] Japan ................................ 1-18096

[51] Int. Cl.$^5$ .............................................. C04B 35/48
[52] U.S. Cl. ..................................... 501/134; 501/135; 501/136; 501/137; 501/138; 501/139
[58] Field of Search ............... 501/134, 135, 136, 137, 501/138, 139

[56] References Cited

U.S. PATENT DOCUMENTS 4,216,102 8/1980 Furukawa et al. ................. 501/134

FOREIGN PATENT DOCUMENTS

| 55-032723 | 3/1980 | Japan | 501/135 |
| 55-068004 | 5/1980 | Japan | 501/135 |
| 58-045155 | 3/1983 | Japan | 501/134 |
| 61-758612 | 7/1986 | Japan | 501/134 |

OTHER PUBLICATIONS

"Erekutoroniku Seramikkusu (Electronic Ceramic)", by K.K. Gakkansha, Mar. 1986, pp. 41–45.

*Primary Examiner*—William R. Dixon, Jr.
*Assistant Examiner*—Anthony J. Green
*Attorney, Agent, or Firm*—Fleit, Jacobson, Cohn, Price, Holman & Stern

[57] ABSTRACT

The present invention provides a dielectric ceramic composition for use in a high-frequency range represented by the general formula $(1-x)Ba_{1-y}(Zn_{\frac{1}{3}},Ta_{\frac{2}{3}})O_3 + xBa_{1-y}ZrO_3$. In the formula, y is $0.004 \leq y \leq 0.013$ and x is the amount of substitution of $Ba_{1-y}ZrO_3$ and $0 < x \leq 0.06$. This composition is prepared by weighing raw materials so that the mixing ratio of Ba is slightly smaller than that of the stoichiometric composition, calcining the resultant mixture to prepare a calcination product, grinding the calcination product through only dry process without conducting wet pulverization, molding the resultant powder, and sintering the molded product at 1600° to 1700° C. for 1 to 10 hr.

3 Claims, 4 Drawing Sheets y : Shortage of Ba

Sintering Time (hour)

DIELECTRIC CERAMIC COMPOSITION FOR USE IN HIGH-FREQUENCY RANGE AND PROCESS FOR PREPARING THE SAME

BACKGROUND OF THE INVENTION

The present invention relates to a $Ba(Zn_{\frac{1}{3}}Ta_{\frac{2}{3}})O_3$-based dielectric ceramic composition for use in a microwave range and a process for preparing the same. More particularly, the present invention is concerned with a dielectric ceramic composition wherein the regulation of the temperature coefficient at the resonance frequency has been made possible with high reproducibility while maintaining a high Q value by making the barium composition ratio slightly short of the stoichiometric amount, and a process for preparing a dielectric ceramic composition wherein a calcination product is sintered without wet pulverization.

This dielectric ceramic composition can be utilized in, e.g., a dielectric resonator, a dielectric substrate for MIC, etc. for use in a high-frequency range such as a microwave or millimeter wave region.

As regards $Ba(Zn, Ta, Zr)O_3$-based material, several researches have been already made. For example, a dielectric ceramic composition for use in a high-frequency range represented by the following general formula is known in the art:
$Ba(Zr_xZn_yTa_z)O_{7/2-x/2-3y/2}$ wherein $0.02 \leq x \leq 0.13$, $0.28 \leq y \leq 0.33$, and $0.59 \leq z \leq 0.65$, provided that $x+y+z=1$.

In this composition, when the value of x is changed from 0.02 to 0.13, the temperature coefficient, $\tau f$, at the resonance frequency is $-1$ to $16$ ppm/°C. Further, in this composition, the Q value exceeds 10,000 when $0.04 \leq x \leq 0.09$.

Further it was reported that the temperature coefficient of the above-described composition at the resonance frequency could be set at an arbitrary value around 0 ppm/°C. by substituting Ni and Co for 70 atomic % or less of Zn and adding 0.1 to 10.0 mole % of a lanthanide oxide.

Various series of material have been developed as a dielectric ceramic composition used in a microwave range, and a $Ba(Zn_{\frac{1}{3}}Ta_{\frac{2}{3}})O_3$-based composition is one of such materials. In general, not only these materials but also other ceramic materials are prepared by the following process. At the outset, raw materials are weighed so as to have a predetermined composition, and they are mixed with each other. The mixture is calcined, wet pulverized, and dried. Subsequently, the dried powder is kneaded with a binder, granulated, molded, and sintered under suitable conditions.

A pure $Ba(Zn_{\frac{1}{3}}Ta_{\frac{2}{3}})O_3$ composition free from any additive (stoichiometric composition) is poor in sinterability even when it is sintered at a temperature as high as 1600° to 1700° C. Further, in this case, when the sintering is conducted for a long period of time, there occurs abnormal grain growth, which brings about a remarkable lowering in the density, so that it is difficult to control the dielectric constant, $\epsilon r$.

However, it was reported that an unloaded Q value at 12 GHz could be improved up to about 14000 by sintering at a temperature of 1350° to 1600° C. for more than ten hours to over one hundred hours [see "Erekutoroniku Seramikkusu (Electronic Ceramic)": Gakkensha K.K., Mar. 1986, pp. 41–45]. In this case, the dielectric constant was about 29 to 30. However, it was also reported that the hot pressing could improve the dielectric constant to about 30.2. The temperature coefficient at the resonance frequency was about $0 \pm 0.5$ ppm/°C. in this case.

The dielectric constant and the temperature coefficient at resonance frequency can be regulated to some extent by accurately weighing an additive such as $Ba(Zn_{\frac{1}{3}}Nb_{\frac{2}{3}})O_3$, $BaZrO_3$ or $Ba(Ni_{\frac{1}{3}}Ta_{\frac{2}{3}})O_3$ and adding it to the composition.

Preferably, the material used in a microwave dielectric resonator is one which can be endowed with an arbitrary temperature coefficient, $\tau f$, with high reproducibility while maintaining a high Q value. Further, it is important that the kind of materials to be used be as few as possible and the material can be easily prepared.

In general, in the production of a dielectric ceramic composition, it is necessary to conduct wet pulverization of a calcination product for the purpose of obtaining a dense and uniform sintering product. However, in the step of wet pulverization followed by the step of drying, variation in the composition occurs due to the loss of some of the raw materials in the apparatus, so that the dielectric characteristics fluctuate and the reproducibility is poor.

SUMMARY OF THE INVENTION

An object of the present invention is to solve the above-described technical problems and to provide a dielectric ceramic composition for use in a high-frequency range which has an unloaded Q value as high as about 13000 or more and a dielectric constant of about 30 and enables the temperature coefficient, $\tau f$, at the resonance frequency to have an arbitrary value of 8 ppm/°C. or less with high reproducibility.

As described above, for a dielectric material for use in a microwave range, it is desired that not only the unloaded Q value be high at a high frequency band but also the dielectric constant, $\epsilon r$, and the temperature coefficient, $\tau f$, can be regulated.

However, in order to improve the unloaded Q value in the prior art, it is necessary to conduct sintering at 1350 to 1600° C. for a period of time as long as 120 hr, which brings about a large energy loss and an increase in the cost due to, for example, the consumption of a sintering furnace. Although the dielectric characteristics can be improved by adopting the coprecipitation method, hot pressing method, etc., these methods are unsuitable for the production on a commercial scale, i.e., unsuitable for the practical use.

Further, the dielectric constant and the temperature coefficient at the resonance frequency can be controlled by accurately weighing an additive and adding it to the composition. However, in many cases, the amount of the additive is very small, and the kind of materials to be weighted is increased, which makes it difficult to conduct production control.

When the sintering is conducted at a temperature as high as 1600° C. or above, as described above, the sinterability is poor, while when the sintering time is prolonged, there occurs a problem of deterioration of the characteristics due to evaporation of zinc.

Accordingly, another object of the present invention is to eliminate the above-described drawbacks of the prior art and to provide a process for preparing a dielectric ceramic composition which enables a very high unloaded Q value to be attained through sintering at a high temperature for a short period of time and, at the same time, the dielectric constant and the temperature coefficient at resonance frequency to be controlled with good reproducibility.

The above-described objects can be attained by a dielectric ceramic composition represented by the general formula $(1-x)Ba_{1-y}(Zn_{\frac{1}{3}}, Ta_{\frac{2}{3}})O_3 + xBa_{1-y}ZrO_3$ wherein y is $0.004 \leq y \leq 0.013$ and the amount of substitution of $Ba_{1-y}ZrO_3$, x, is $0 < x \leq 0.06$.

Further, the present invention provides a process for preparing a dielectric ceramic composition which comprises weighing raw materials so as to have a composition represented by the general formula $(1-)Ba_{1-y}(Zn_{\frac{1}{3}}, Ta_{\frac{2}{3}})O_3 + xBa_{1-y}ZrO_3$ wherein y is $0.004 \leq y \leq 0.013$ and the amount of substitution of $Ba_{1-y}ZrO_3$, x, is $0 < x \leq 0.06$, calcining the resultant mixture to prepare a calcination product, grinding the calcination product through only a dry process, molding the resultant powder, and sintering the molding at 1600° to 1700° C. for 1 to 10 hr.

DESCRIPTION OF THE PREFERRED EMBODIMENTS

Figure 1:
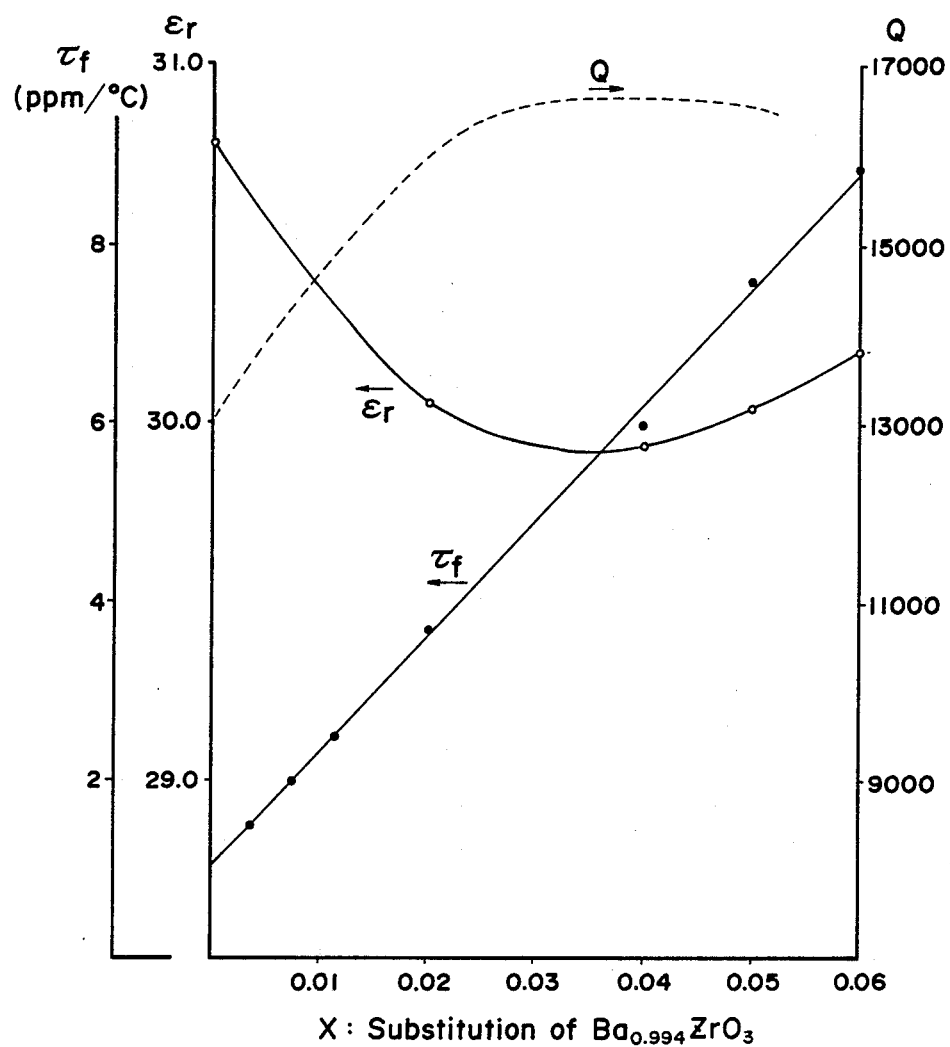
FIG. 1 is a graph showing the relationship between the amount of substitution, x, of a composition comprising $(1-x)Ba_{0.994}(Zn_{\frac{1}{3}}, Ta_{\frac{2}{3}})O_3 + xBa_{0.994}ZrO_3$ and the dielectric characteristics.

The dielectric ceramic composition of the present invention is represented by the general formula $(1-x)Ba_{1-y}(Zn_{\frac{1}{3}}, Ta_{\frac{2}{3}})O_3 + xBa_{1-y}ZrO_3$. In this formula, the value of y is $0.004 \leq y \leq 0.013$, and the amount of substitution, x, of $Ba_{1-y}ZrO_3$ for $Ba_{1-y}(Zn_{\frac{1}{3}}, Ta_{\frac{2}{3}})O_3$ is $0 < x \leq 0.06$.

The value of y, i.e., $0.004 \leq y \leq 0.013$, means that the amount of Ba is reduced to be slightly smaller than that of a stoichiometrical composition. This is based on a finding that a reduction in the amount of Ba immediately brings about a regular arrangement of Zn and Ta as B site ions in a perovskite structure, which makes it possible to conduct satisfactory sintering in the step of sintering at a high temperature for a short period of time. The reason for the limitation of the value of y to the above-described range is that when the value of y is smaller than 0.004, sintering becomes difficult because the composition approaches a stoichiometric one, while when the value of y exceeds 0.013, the dielectric characteristics, particularly Q value, are lowered.

The substitution of $Ba_{1-y}ZrO_3$ substantially linearly changes the temperature coefficient, τf, at the resonance frequency depending upon the amount of substitution, which enables the temperature coefficient to have an arbitrary value. The reason for the limitation of the value of x to $0 < x \leq 0.06$ is that the wider range adjustment of the temperature coefficient, τf, at the resonance frequency becomes possible only when such substitution is conducted, and that when the value of x exceeds 0.06, the composition is not suitable for practical use because the Q value is high but the temperature coefficient, τf, at the resonance frequency becomes larger than 8 ppm/° C., which is the upper limit for a practical use.

This type of dielectric ceramic composition is prepared by the following process: mixing of raw materials→calcination→pulverization→molding→sintering. The pulverization of the calcination product exhibits a great effect on the denseness and uniformity of the sintering product. Therefore, in general, wet pulverization is conducted for a long period of time and the powder thus obtained is dried and granulated. By contrast, in the dielectric ceramic composition of the present invention, there is no need of conducting such wet pulverization, because the calcination product is very soft and, even when a coarse crushing product having a size that will be obtained through crushing by hand is granulated, molded, and sintered, the crystal grain diameter is so small that there occurs substantially no influence on both the sinterability and the dielectric characteristics. Further, since no wet pulverization is conducted, there occurs no deviation in the composition due to the loss of some of the raw materials in the apparatus, which enables the temperature coefficient at the resonance frequency to have a desired value with good reproducibility depending upon the accuracy of weighing and blending of the raw materials.

The dielectric ceramic composition according to the present invention is sintered at 1600° to 1700° C. When the sintering temperature is below 1600° C., no sintering occurs. On the other hand, when it exceeds 1700° C., the evaporation of Zn becomes remarkable. The sintering time is 10 hr or less, preferably about 1 to 4 hr.

Example 1

$BaCO_3$, ZnO, $Ta_2O_5$, and $ZrO_2$ each having a high purity were used as raw materials and weighed so as to provide several samples having a composition represented by the formula $(1-x)Ba_{0.994}(Zn_{\frac{1}{3}}, Ta_{\frac{2}{3}})O_3 + xBa_{0.994}ZrO_3$ while varying the value of x. The weighed raw materials were subjected to wet mixing together with pure water in a ball mill for 20 hr. The mixture was taken out, dried, and calcined at 1300° C. for 10 hr. The calcination product which is readily crushed was slightly crushed in a mortar. The powder thus obtained was mixed with a binder, and the mixture was granulated. The granules were molded under a pressure of 3000 $Kg/cm^2$ into a disk form having a diameter of 14 mm and a thickness of 6 mm. The molded product was then sintered at 1650° C. for 4 hr to prepare a dielectric ceramic composition. Both the upper and lower surfaces and the side were cut to prepare a sample for measurement.

This sample was subjected to measurement of the dielectric constant, εr, Q value, and the temperature coefficient, τf, at a frequency of 7 GHz by the dielectric rod resonator method.

The results of the measurement are shown in FIG. 1. As is apparent from the drawing, the temperature coefficient, τf, at the resonance frequency substantially linearly increases with an increase in the amount of substitution, x, of $Ba_{0.994}ZrO_3$. In this case, the Q value starts with 13000, reaches about 16600 when the value of x is $0.03 \leq x \leq 0.05$, and then gradually decreases. Thus, the Q value is kept at a very high value. The dielectric constant, εr, was about 29.9 to 30.8.

As described above, the composition of the present invention is a dielectric ceramic composition for use in a high-frequency range wherein part of a $Ba(Zn, Ta)O_3$- based material having a Ba content slightly smaller than that of the stoichiometric composition is replaced with a BaZrO$_3$-based material having a Ba content slightly smaller than that of the stoichiometric composition. In this composition, it is possible to attain a Q value as high as about 13000 or more and a dielectric constant of about 30. Further, the temperature coefficient at the resonance frequency can be freely set at an arbitrary value of about −1 to 8 ppm/° C. by regulating only the amount of substitution of key raw materials without the need of any special additive.

According to another aspect of the present invention, there is provided a process for preparing a dielectric ceramic composition which comprises weighing raw materials so as to have a composition represented by the general formula Ba$_{1-y}$(Zn$_{\frac{1}{3}}$Ta$_{\frac{2}{3}}$)O$_3$ wherein $0.004 \leq y \leq 0.013$, calcining the resultant mixture to prepare a calcination product, grinding the calcination product through only dry process without conducting wet pulverization, molding the resultant powder, and sintering the molded product at 1600° to 1700° C. for 1 to 10 hr.

In general, a process for preparing a ceramic comprises the following steps in that order: mixing→calcination→pulverization→molding→sintering. The pulverization of the calcination product is generally conducted for over ten hours to several tens of hours. After the completion of the wet pulverization, the pulverization product is dried, granulated, and molded.

In the process of the present invention, only dry grinding is conducted with no wet pulverization step and the dielectric ceramic composition is prepared in such a mixing ratio that the barium composition is slightly short of the stoichiometric composition.

When the calcination product of a Ba(Zn$_{\frac{1}{3}}$Ta$_{\frac{2}{3}}$)O$_3$-based dielectric ceramic composition is subjected to wet pulverization for a long period of time, the surface of the powder becomes so unstable that barium contained in the powder reacts with water to form a hydroxide (mechanochemical reaction). The hydroxide absorbs carbon dioxide present in the air in the subsequent step of drying to form barium carbonate. This step exhibits the same effect as that of recrystallization and brings about an appearance of a columnar macrocrystal. The appearance of this macrocrystal causes the sinterability to be extremely deteriorated. This is because the barium carbonate is decomposed during sintering to generate carbon dioxide while leaving barium oxide intact. Inclusion of such a decomposition product makes it difficult to increase the density, with the result of a failure in preparation of uniform sintering. This is believed to be one of the reasons why sintering should have been conducted for a period of time as long as ten hours to over one hundred hours in the prior art.

However, it has now been found that this type of material is very soft even after calcination and, even when a coarse crushing product having a size that will be obtained by crushing by hand is immediately sintered, the grain diameter is so small that it can hardly affect both of the sinterability and the dielectric characteristics. In the present invention, since only dry grinding is employed without wet pulverization, no macrocrystal of barium carbonate appears and an excellent sinterability can be attained.

As described above in connection with the prior art, the ceramic composition in this series of material does not sinter in a stoichiometric composition even when heated at a high temperature of 1600° C. or above. It does not sinter also when no wet pulverization step is employed. Zn and Ta as the B site ions of an ABO$_3$ perovskite ceramic represented by the formula Ba(Zn$_{\frac{1}{3}}$Ta$_{\frac{2}{3}}$)O$_3$ brings about a regular arrangement when sintered for a long period of time, so that superlattice reflection is observed. This is one of the reasons why, as described above, sintering for a long period of time was required in the prior art. It has now been found that a reduction in the amount of Ba as the A site ion can give rise to the above-described arrangement in a short time. Specifically, making the amount of Ba short of the stoichiometric composition enables an improvement in the dielectric characteristics through sintering at a high temperature for a short period of time.

An improvement in the Q value can be attained in a short time by raising the sintering temperature. This is the reason why sintering is conducted in the present invention at a temperature as high as 1600° to 1700° C. However, it should be noted that mere sintering at a high temperature does not bring about a favorable effect of sintering, that is, matured density. For this reason, in the present invention, the amount of Ba is set at a value short of that of the stoichiometric composition. Specifically, the value of y is set as: $0.004 \leq y \leq 0.013$. The lower limit was set at 0.004 based on the criterion that satisfactory characteristics can be obtained when sintering is conducted at 1600° C. for 1 hr. This is because when the sintering time is shorter than 1 hr, no satisfactory sintering effect can be obtained. On the other hand, sintering for a period of time exceeding 10 hr is unfavorable because not only the Q value etc. are not so much affected thereby but also sintering for a long period of time is unfavorable from the viewpoint of energy loss and the characteristics are deteriorated due to the progress of evaporation of Zn. The reason why the upper limit of the amount of shortage, y, of Ba was set at 0.013 is that the dielectric characteristics are lowered when the value exceeds 0.013.

The regulation of the amount of shortage of Ba enables the dielectric constant and temperature coefficient at the resonance frequency to be regulated while maintaining a high unloaded Q value without addition of any additive.

Example 2

BaCO$_3$ having a purity of 99.7%, ZnO having a purity of 99.9%, and Ta$_2$O$_5$ having a purity of 99.9% as the starting materials were weighed so as to have a composition represented by the general formula Ba$_{1-y}$(Zn$_{\frac{1}{3}}$Ta$_{\frac{2}{3}}$)O$_3$ wherein $0.004 \leq y \leq 0.01$, and subjected to wet mixing together with pure water for 20 hr in a polyethylene ball mill containing zirconia balls. The resulting mixture was taken out of the ball mill, dried, molded by making use of a mold and a hydraulic press under a molding pressure of 500 kg/cm$^2$, and calcined in the air at 1300° C. for 10 hr.

The calcination product was slightly crushed in a mortar, and 10% by weight of a polyvinyl alcohol solution was added as a binder to the resultant powder. The mixture was homogenized and passed through a 60-mesh sieve for granulation. The granulated powder was molded by making use of a mold and hydraulic press under a molding pressure of 3000 kg/cm$^2$ into a disk having a diameter of 14 mm.

The molded product was sintered at a temperature of 1600° C. to 1700° C. for 10 hr or shorter to prepare a dielectric ceramic. Both the upper and lower surfaces and the side surface were cut and subjected to measurement of both an unloaded Q value at about 7 GHz and the dielectric constant by the dielectric rod resonator method. The temperature coefficient at the resonance frequency was measured at a temperature of −30° to 80° C.

Figure 2:
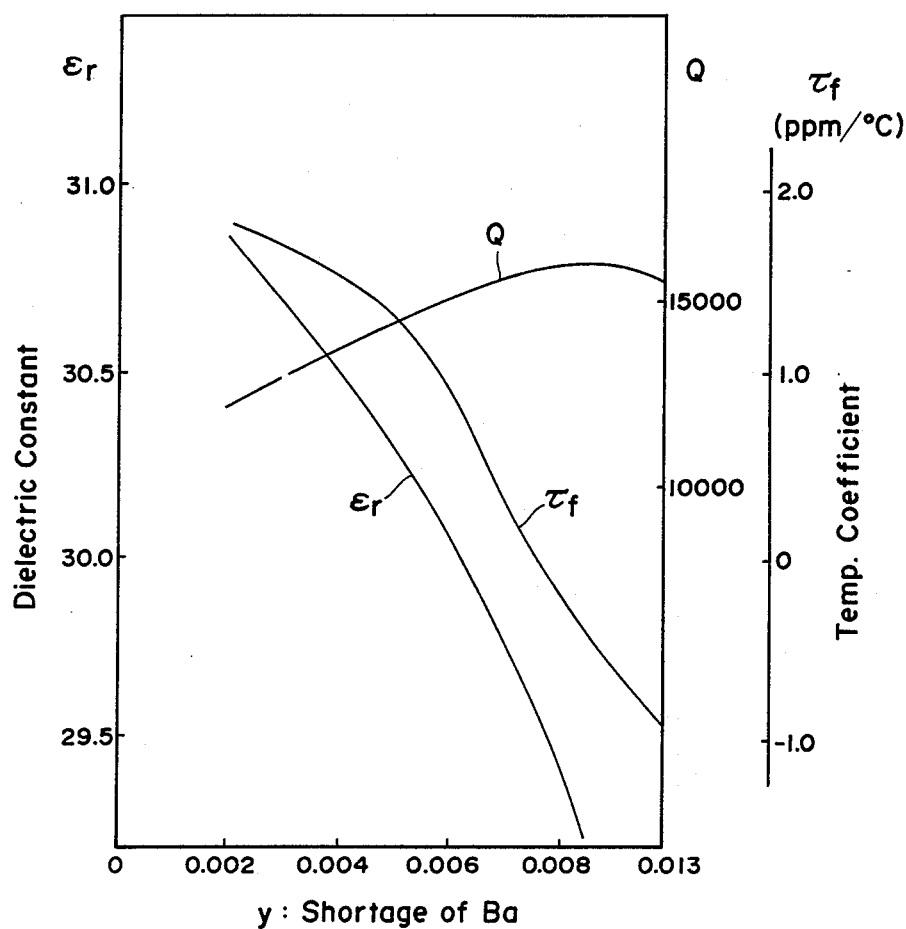
FIG. 2 is a graph showing the dielectric characteristics under sintering conditions of 1600° C. and 4 hr.

FIG. 2 is a graph showing the relationship between the amount of shortage of Ba, y, and the unloaded Q value, dielectric constant, $\varepsilon r$, and temperature coefficient, $\tau f$, at the resonance frequency in the case of sintering at 1600° C. for 4 hr. It is apparent from FIG. 2 that excellent dielectric characteristics can be obtained by making the amount of Ba short of the stoichiometric composition without adopting any wet pulverization step. Further, it is apparent that even when the amount of shortage, y, of Ba is varied, the unloaded Q value remains at a high value while the dielectric constant, $\varepsilon r$, and the temperature coefficient, $\tau f$, at the resonance frequency will be varied. Therefore the regulation of the amount of shortage, y, or Ba enables the dielectric constant, $\varepsilon r$, and the temperature coefficient, $\tau f$, at the resonance frequency to be regulated while maintaining a high Q value.

Figure 3:
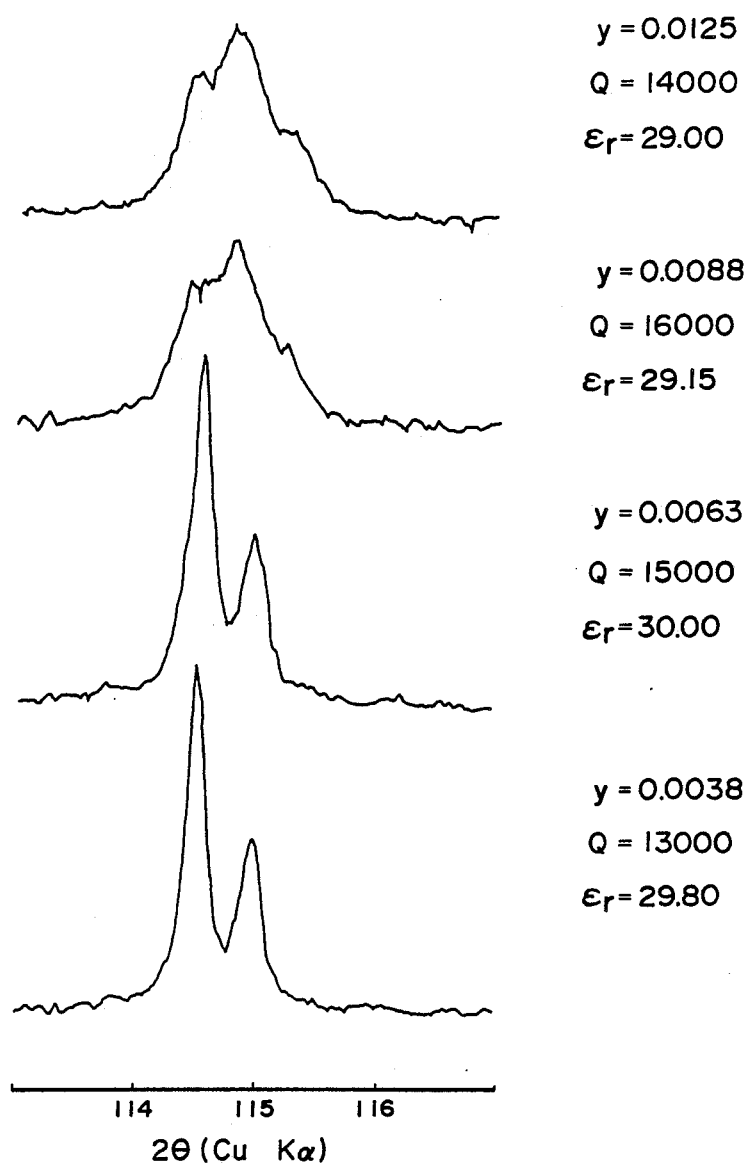
FIG. 3 is a diagram showing an X-ray diffraction pattern on the amount of shortage of Ba.

The reason why the dielectric constant, $\varepsilon r$, varies depending upon the amount of shortage of Ba is believed to reside in a remarkable difference in the crystal structure. This is apparent from FIG. 3 which shows the results of measurement of superlattice reflection of Zn and Ta through X-ray diffractometry. As is apparent from the drawing, even when the sintering conditions are the same, variations in the composition ratio of Ba bring about a large difference in the extent of regular arrangement and the dielectric characteristics.

Figure 4:
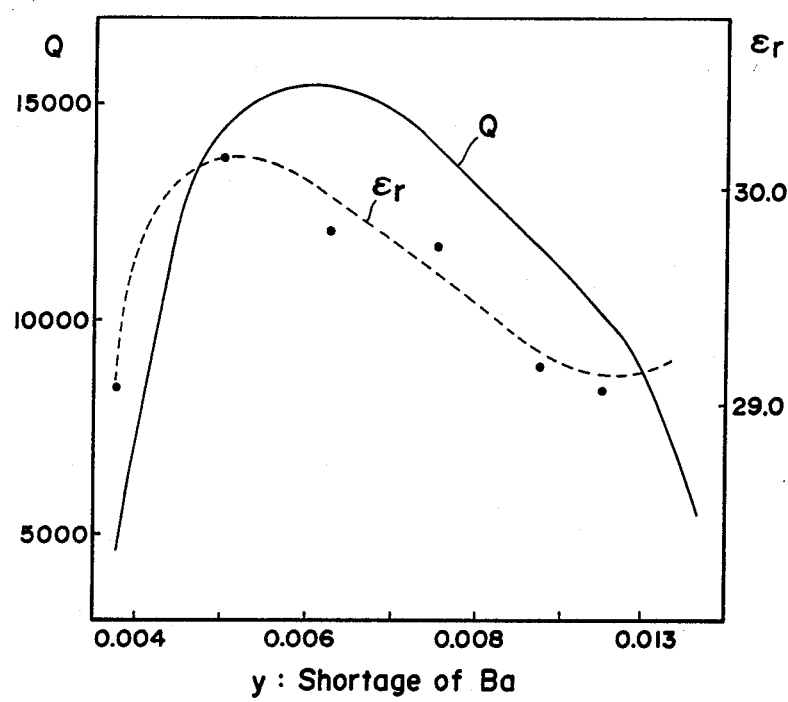
FIG. 4 is a graph showing the dielectric characteristics under sintering conditions of 1600° and 1 hr.

FIG. 4 is a graph showing the dielectric characteristics under sintering conditions of 1600° C. and 1 hr. As is apparent from FIG. 4, the range of amount of shortage, y, of Ba satisfying characteristics requirement for practical use under the worst sintering conditions of 1600° C. and 1 hr is 0.004 to 0.01. The numerical value of the range of the present invention has been determined based on the above-described experimental results. Under this sintering condition, the unloaded Q reaches the maximum value when the amount of shortage, y, of Ba is 0.006, while the dielectric constant, $\varepsilon r$, reaches the maximum value when y is about 0.005.

Figure 5:
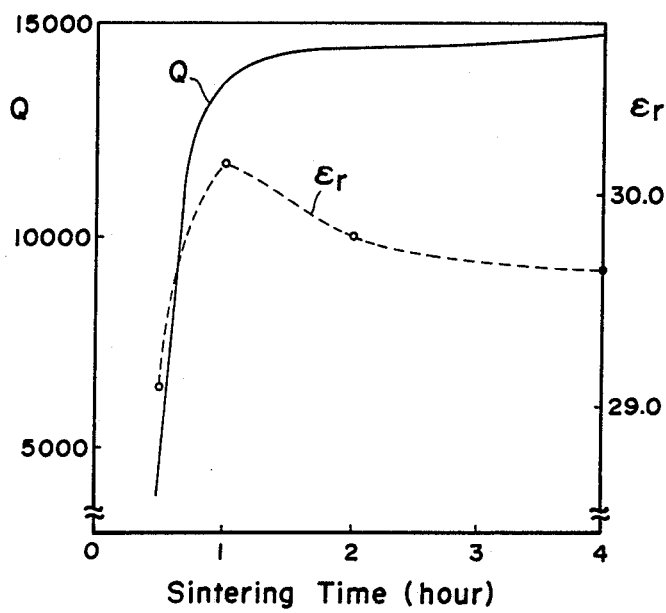
FIG. 5 is a graph showing the relationship between the sintering time of a composition having an unloaded y value of 0.005 at a sintering temperature of 1600° C. and the dielectric characteristics.

FIG. 5 is a graph showing the dielectric charcteristics in the case of sintering at 1600° C. with the amount of shortage, y, of Ba being 0.005. In the graph, the abscissa represents the sintering time. The unloaded Q value rapidly increases in a sintering for 1 hr and then gradually increases. The dielectric constant, $\varepsilon r$, reaches the maximum value when the sintering time is 1 hr and thereafter gradually lowers.

In view of the above, the sintering time should be at least 1 hr. The reason why the upper limit of the sintering time was set at 10 hr is as follows. Even when sintering is conducted for a period of time exceeding 10 hr, no further significant improvement in the characteristics can be attained. As described already, sintering for a long period of time causes the evaporation of Zn component and therefore lowers the dielectric constant. Further, sintering for a long period of time unfavorably leads to energy loss.

As described above, the process of the present invention comprises weighing the raw materials so that the mixing ratio of Ba is slightly smaller than that of the stoichiometric composition, calcining the resultant mixture to prepare a calcination product, grinding the calcination product through only dry process without conducting wet pulverization, molding the resultant powder, and sintering the molded product at 1600° to 1700° C. for 1 1 to 10 hr. This process can remarkably shorten the sintering time required in the prior art which was as long as tens of hours to over one hundred, which enables a remarkable reduction in the production cost including a reduction in the energy cost. Further, in the prior art, the coprecipitation method and hot pressing method must be employed for attaining a dielectric constant as high as about 30 or more, whereas in the present invention, a composition having such a high dielectric constant can be freely selectively prepared through usual atmospheric sintering.

Further, in the method of the present invention, the temperature coefficient at the resonance frequency and the dielectric constant can be regulated with good reproducibility through mere variation in the mixing ratio of key raw materials without necessity of addition of any additive.

The process of the present invention requires neither step of wet pulverization nor step of drying accomanying the wet pulverization, so that not only the weighing error due to the loss of the raw materials in the apparatus can be reduced but also no substance which makes the sintering difficult is formed, which enables the preparation of a dielectric ceramic composition having excellent characteristics with simplified procedures.

What is claimed is:

1. A dielectric ceramic composition for use in a high-frequency range represented by the general formula $(1-x)Ba_{1-y}(Zn_{\frac{1}{3}}, Ta_{\frac{2}{3}})O_3 + xBa_{1-y}ZrO_3$ wherein y is $0.004 \leq y \leq 0.013$ and x is the amount of substitution of $Ba_{1-y}ZrO_3$ and $0 < x \leq 0.06$.

2. A process for preparing a dielectric ceramic composition which comprises weighing raw materials so as to have a composition represented by the formula $(1-x)Ba_{1-y}(Zn_{\frac{1}{3}}, Ta_{\frac{2}{3}})O_3 + xBa_{1-y}ZrO_3$ wherein y is $0.004 \leq y \leq 0.013$ and x is the amount of $Ba_{1-y}ZrO_3$ and $0 < x \leq 0.06$, mixing said raw materials, calcining the resultant mixture at about 1300° C. for about 10 hours to produce a calcination product, grinding the calcination product by a dry process, molding the resultant powder, and sintering the resulting molded product at 1600° to 1700° C. for 1 to 10 hr.

3. A process according to claim 2 wherein said raw materials comprise $BaCO_3$, $ZnO$, $Ta_2O_5$ and $ZrO_2$.

* * * * *